US006245158B1

(12) United States Patent
Verhaverbeke

(10) Patent No.: US 6,245,158 B1
(45) Date of Patent: Jun. 12, 2001

(54) WET PROCESSING METHODS FOR THE MANUFACTURE OF ELECTRONIC COMPONENTS USING LIQUIDS OF VARYING TEMPERATURE

(75) Inventor: Steven Verhaverbeke, Radnor, PA (US)

(73) Assignee: CFMT, Inc., Wilmington, DE (US)

( * ) Notice: Subject to any disclaimer, the term of this patent is extended or adjusted under 35 U.S.C. 154(b) by 0 days.

(21) Appl. No.: 09/324,813

(22) Filed: Jun. 2, 1999

Related U.S. Application Data

(60) Provisional application No. 60/087,758, filed on Jun. 2, 1998.

(51) Int. Cl.⁷ .................................. B08B 3/10; B08B 7/04
(52) U.S. Cl. .............................. 134/10; 134/25.4; 134/35
(58) Field of Search .................................. 134/3, 10, 18, 134/25.4, 26, 28, 29, 35, 36

(56) References Cited

U.S. PATENT DOCUMENTS

| | | | |
|---|---|---|---|
| 4,577,650 | 3/1986 | McConnell | 134/59 |
| 4,633,893 | 1/1987 | McConnell et al. | 134/95 |
| 4,738,272 | * 4/1988 | McConnell | 134/59 |
| 4,740,249 | * 4/1988 | McConnell | 134/25.4 |
| 4,778,532 | * 10/1988 | McConnell et al. | 134/10 |
| 4,856,544 | * 8/1989 | McConnell | 134/95 |
| 4,911,761 | * 3/1990 | McConnell et al. | 134/11 |
| 4,917,123 | * 4/1990 | McConnell et al. | 134/95 |
| 4,984,597 | 1/1991 | McConnell et al. | 134/95 |
| 5,896,875 | 4/1999 | Yoneda | 134/102.3 |

FOREIGN PATENT DOCUMENTS 0 233 184    4/1992   (EP) .

OTHER PUBLICATIONS

Burkman et al., "Wet Chemical Processes—Aqueous Cleaning Processes", Handbook of Semiconductor Wafer Cleaning Technology, Kern, W. (Ed.), Noyes Publication, Parkridge, NJ, 1993, Chapter 3, 111–151.

Horiki, H. et al., "Wet Etch Cleaning", in *Ultraclean Technology Handbook,* Ohmi, T. (ed.), Marcel Dekker, 1991, vol. 1, Ch. 3, 805–819.

Kern, W. "Overview and Evolution of Semiconductor Wafer Contamination and Cleaning Technology", Handbook of Semiconductor Wafer Cleaning Technology, Kern, W. (Ed.), Noyes Publication, Parkridge, NJ, 1993, Chapter 1, 3–67.

Verhaverbeke, S. et al., "Scientific Rinsing and Drying on Macro and Microscale," in *Semiconductor Pure Water and Chemicals Conference 1996,* Balazs, M.K. (ed.), Santa Clara, CA Mar. 4–7, 1996, 14 pages.

* cited by examiner

*Primary Examiner*—Randy Gulakowski
*Assistant Examiner*—Saeed Chaudhry
(74) *Attorney, Agent, or Firm*—Woodcock Washburn Kurtz Mackiewicz & Norris LLP

(57) ABSTRACT

The present invention is directed to wet processing methods for the manufacture of electronic component precursors, such as semiconductor wafers used in integrated circuits. More specifically, this invention relates to methods of manufacturing electronic component precursors using liquids of varying temperature.

18 Claims, 2 Drawing Sheets

WET PROCESSING METHODS FOR THE MANUFACTURE OF ELECTRONIC COMPONENTS USING LIQUIDS OF VARYING TEMPERATURE

This application claims benefit to U.S. provisional application No. 60/087,758 filed Jun. 2, 1998.

FIELD OF THE INVENTION

The present invention is directed to wet processing methods for the manufacture of electronic components and electronic component precursors, such as semiconductor wafers used in integrated circuits. More specifically, this invention relates to methods of, for example, processing electronic component precursors using liquids of varying temperature.

BACKGROUND OF THE INVENTION

Wet processing is used extensively during the manufacture of integrated circuits, which typically comprise electronic component precursors such as semiconductor wafers or flat panels. Generally, the electronic component precursors are placed in a bath or a vessel and then contacted with a series of reactive chemical process liquids and rinsing liquids. The process liquids may be used, without limitation, for etching, photoresist stripping, prediffusion cleaning, and other cleaning steps of the electronic component precursors. See, e.g., U.S. Pat. Nos. 4,577,650; 4,740,249; 4,738,272; 4,856,544; 4,633,893; 4,778,532; 4,917,123; and EPO 0 233 184, assigned to a common assignee, and Burkman et al., *Wet Chemical Process-Aqueous Cleaning Processes*, pp.111–151, in Handbook of Semiconductor Wafer Cleaning Technology (edited by Werner Kern, Published by Noyes Publication Parkridge, N.J. 1993), the disclosures of which are herein incorporated by reference in their entirety.

In a typical wet processing technique, the electronic component precursors are treated in either a full flow vessel (a vessel closed to the environment), single tank, compact wet bench, traditional wet bench, or bath. In typical wet processing techniques, the electronic component precursors are exposed to reactive chemical process liquids to either remove (i.e., clean) contamination on the electronic component precursors or to etch some part of the surface. After this cleaning or etching is performed, the chemicals will adhere to the surface or surfaces of the electronic component precursors. The adhered chemicals generally may be removed before treating the electronic component precursors with the next reactive chemical process liquid so that the chemical residue does not contaminate the next reactive chemical process. Traditionally, the adhered chemical is removed by rinsing with deionized (DI) water.

After the chemical treatment steps are completed, the wafers are generally dried. Drying of the electronic component precursors can be done using various methods, with the goal being to ensure that there is no contamination created during the drying process. Methods of drying include evaporation, centrifugal force in a spin-dryer, steam or chemical drying of wafers, including the method and apparatus disclosed in, for example, U.S. Pat. Nos. 4,778,532 and 4,911,761.

One of the most important considerations for an effective wet processing method is that the wafers produced by the process be ultraclean (i.e., with minimum particle contamination and minimum chemical residue). Certain techniques use DI water to remove particulate matter and chemical residue after each chemical treatment step.

Traditionally, the electronic component precursors are transferred from a reaction chamber containing the chemicals to a rinsing tank containing DI water. Alternatively, the electronic component precursors can be left in the reaction chamber containing the chemicals and the chemicals can be displaced from the reaction chamber by introducing DI water into the chamber. The DI water can be introduced into the reaction chamber either from the top or bottom of the reaction chamber. See, e.g., U.S. Pat. Nos. 4,778,532 and 4,984,597, the disclosures of which are herein incorporated by reference in their entirety. In such a reaction chamber where the electronic component precursors are stationary and where chemicals are displaced by DI water, usually water is introduced from the bottom of the tank, and the chemicals are drained from the top of the tank. It is also possible, however, to introduce water into the top of the tank and to drain the chemicals from the bottom of the tank.

Traditionally, the chemicals in the reaction chamber and the displacing DI water also have the same temperature, which usually causes intimate mixing of the chemicals and the DI water. This causes the chemicals to be continuously diluted with water, which is undesirable since it is both environmentally preferable and cost effective to recycle the chemical solutions. In addition, it takes significantly longer to rinse when mixing occurs than if no mixing occurs. If minimal mixing occurs, the chemical solution is quickly removed from the vessel, as in plug-flow techniques. If mixing continuously occurs, however, then rinsing takes much longer, and theoretically approaches the model of a CSTR (continuously stirred tank reactor). Verhaverbeke, S., McConnell, C., Parker, J. W., and Bay, S., *Scientific Rinsing and Drying on Macro and Microscale* (SPWCC, Mar. 4–7, 1996) in Semiconductor Pure Water and Chemicals Conference 1996 (Balazs Analytical Laboratory, Santa Clara, Calif.), the disclosures of which are incorporated herein by reference in their entirety.

Thus, there is the need in the art for a simple and efficient method that permits the efficient rinsing of electronic component precursors, while at the same time providing an environmentally safe and economical method.

SUMMARY OF THE INVENTION

The present invention presents, inter alia, wet processing methods for the manufacture of electronic components and electronic component precursors, such as semiconductor wafers used in integrated circuits. More specifically, this invention relates to methods of, for example, processing electronic component precursors using wet processing techniques with liquids of varying temperature.

It has been discovered that by selectively controlling the temperature of the process liquids used during a wet processing technique, the dilution of the chemicals with DI water during rinsing can be minimized. Since mixing is minimized, rinsing efficiency is optimized. Thus, controlling temperature can save time, money, and enhance throughput.

In particular, according to methods of the invention, electronic component precursors are placed in a reaction chamber; a reactive chemical process liquid is introduced into the reaction chamber; the electronic component precursors are exposed to the reactive chemical process liquid for a selected period of time; a nonreactive chemical process liquid or rinsing liquid is then introduced into the reaction chamber to displace the reactive chemical process liquid, wherein said nonreactive chemical process liquid and/or rinsing liquid has a temperature different than the reactive chemical process liquid.

It has been discovered that when using a closed and/or hydraulically full reaction chamber (for example, the one disclosed in U.S. Pat. No. 4,778,532), where the DI water is introduced from the bottom, it is more efficient to displace the chemicals with DI water that is at least 5° C. cooler than the chemicals that are being displaced; generally, the water should be as cold as possible without significantly reducing flow rates. Introducing the cooler water from the bottom of the vessel minimizes mixing of the displacing rinsing liquid with the chemicals in the tank when the water contacts the warmer electronic component precursors and process liquids, thereby making the displacement more efficient.

On the other hand, if the DI water (the most common rinsing liquid) is introduced from the top of the reaction chamber, it is more efficient to use DI water that is at least 5° C. warmer than the chemicals being displaced; generally, the water should be as warm as possible without significantly reducing flow rates. In practicing the methods of the claimed invention, the electronic component precursors should generally be rinsed with approximately 2–3 vessel volumes of rinse liquid that is either 5° C. warmer or 5° C. cooler depending on whether the rinse liquid is being introduced from the top or the bottom of the vessel, as explained above. For example, if the process vessel has a volume of 5 gallons, then it is preferable to rinse with 10–15 gallons of rinsing liquid at the temperatures specified herein.

The electronic component precursors may be exposed to various reactive and nonreactive chemical process liquids during the course of a wet processing treatment. The number and kinds of process liquids used will depend on the particular end result desired (i.e., whether cleaning, etching and/or stripping). After the last step, the liquid is removed from the reaction chamber and the electronic component precursors are dried.

DETAILED DESCRIPTION OF THE INVENTION

Figure 1:
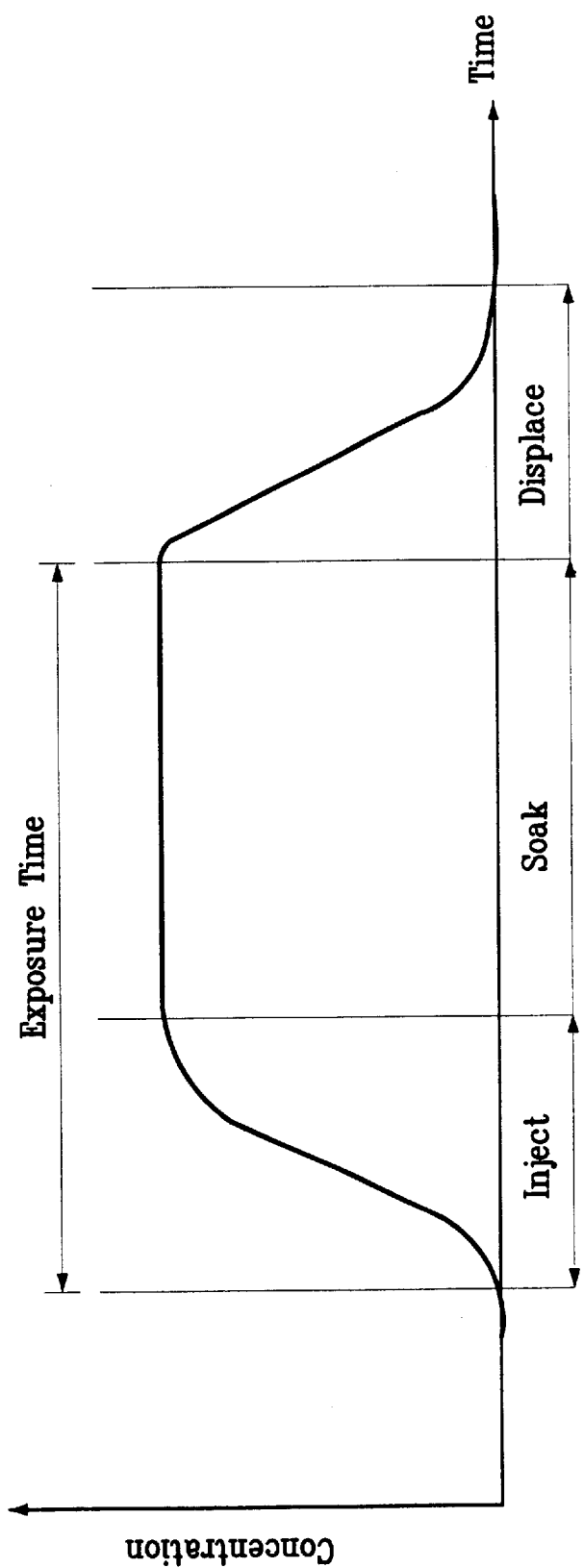
FIG. 1 is a graphical depiction of a typical concentration profile in a CFM Full-Flow™ vessel during a complete etch cycle. In the inject phase, chemicals are injected into water that is flowing in to the vessel. In the soak phase, the chemicals are stationary in the vessel. The exposure time is the overall time that the wafers are exposed to chemicals (i.e., the inject time and the soak period). During the displace phase, a rinse liquid is used to remove etchant from the vessel. Because of the "first-in, first-out" nature of the process, this phase is a mirror image of the inject phase. For example, when the bottom of the wafers are exposed to the etchant first during the inject, they are then rinsed first, such that the overall exposure of the wafer surface to the etchant is uniform.

The terms "reactive process liquid," "reactive chemical process liquid," "processing liquid," "chemical liquid," "active chemical," or "reactive chemical process liquid," as used herein, refer to liquids that electronic component precursors are exposed to during a wet processing technique that perform some action on the surfaces of the electronic components. For example, the liquid may have activity in removing contamination such as particulate, metallic, or organic materials from the surfaces of the electronic components, or the liquid may have some activity in etching the surface of the electronic component, or activity in growing an oxide layer on the surface of the electronic component. An example of such a reactive chemical process liquid is an aqueous solution of hydrofluoric acid (HF), which may have a concentration greater than 1000:1 ($H_2O$:HF). These terms may be used interchangeably.

The term "rinsing liquid," as used herein, refers to DI water or some other liquid that is used to rinse the electronic component as compared to treating them with an active chemical or reactive chemical process liquid. A rinsing liquid may be, for example, DI water or a very dilute aqueous solution of an active or reactive chemical (such as hydrochloric or acetic acid) to prevent, for example, metallic deposition on the surface of the electronic component. Surfactants, anti-corrosion agents, and/or ozone are examples of other additives that may be used in rinsing fluids. The concentration of such additives in the rinsing fluid is generally minute. For example, the concentration is preferably not greater than about 1000 ppm by weight and more preferably not greater than 100 ppm by weight based on the total weight of the rinsing fluid. In the case of ozone, preferably the concentration in the rinsing fluid is 5 ppm or less. Generally, a goal of the rinsing liquid is to remove chemicals, particulates, or reaction products from the electronic component surfaces, and reaction chamber, and to inhibit redeposition of particulates. The terminology "non-reactive chemical process liquid" or "inert" liquid as used herein may also be used.

The term "chemical treatment step," as used herein, refers to exposing the electronic component precursors to a series of process liquids to, for example, clean or etch the surfaces of the electronic component precursors.

The term "reaction chamber," as used herein, refers to vessels, full flow vessels or single tank systems, baths, wet benches and other reservoirs suitable to wet processing methodologies.

As used herein, the term "vessel volume," when used in relation to a reaction chamber, refers to the volume of liquid that such a reaction chamber may hold.

As used herein, the term "full flow vessel," refers to a vessel that is closed to the environment and is employed in a "full flow method," an example of a one bath system.

As used herein, the term "single vessel," refers to any wet processing system in which the electronic component precursors are maintained in one vessel during a wet chemical processing technique.

As used herein, the term "electronic component precursors" includes, without limitation, semiconductor wafers, flat panels, and other components used in the manufacture of electronic components (i.e., integrated circuits).

The methods of the invention are generally applicable to any wet processing equipment where chemical treatment steps and any rinse step are performed in the same chamber including, without limitation, full flow methods, single bath systems, and compact wet benches. See, e.g., Chapter 1: Overview and Evolution of Semiconductor Water Contamination and Cleaning Technology, by Werner Kern, and Chapter 3: Aqueous Cleaning Processes, by Don C. Burkman, Donald Deal, Donald C. Grant, and Charlie A. Peterson, in Handbook of Semiconductor Wafer Cleaning Technology (edited by Werner Kern, Published by Noyes Publication Parkridge, N.J. 1993), and Wet Etch Cleaning by Hiroyuki Horiki and Takao Nakazawa in Ultraclean Technology Handbook, Volume 1 (edited by Tadahiro Ohmi, published by Marcel Dekker), the disclosures of which are herein incorporated by reference in their entirety.

Semiconductor fabrication is described generally, for example, in P. Gise et al., Semiconductor and Integrated Circuit Fabrication Techniques (Reston Publishing Co., Reston, Va., 1979), the disclosures of which is herein incorporated by reference in its entirety.

The reactive chemical process liquids suitable for practicing the invention include, without limitation, aqueous solutions of hydrochloric acid and buffers comprising the same, ammonium hydroxide and buffers comprising the same, hydrogen peroxide, sulfuric acid and buffers comprising the same, mixtures of sulfuric acid and ozone, hydrofluoric acid and buffers comprising the same, acetic acid and buffers comprising the same, phosphoric acid and buffers comprising the same, ammonium fluoride buffered hydrofluoric acid, and combinations thereof. The particular process liquids used, the equipment used, the exposure time, and the experimental conditions (i.e., temperature, concentration, and flow of the process liquid) will vary depending on the particular purpose of the particular wet processing methodology.

The nonreactive chemical process liquids suitable for practicing the invention include, without limitation, deionized water or very dilute solutions of deionized water with an active chemical or an organic solvent. Examples of such chemicals in rinsing liquids include, without limitation, hydrochloric acid, hydrofluoric acid, hydrogen peroxide, ozone, and surfactants. Examples of organic solvents include, without limitation, acetic acid, isopropanol (IPA), and fluorocarbons.

After chemical treatment, the electronic component precursors may be dried using any method known to those skilled in the art.

A typical processing area for treating electronic component precursors will have storage tanks for chemical reagents, including reagents such as ammonium hydroxide ($NH_4OH$) or hydrofluoric acid (HF). These reagents are typically stored in their concentrated form, which is: hydrogen peroxide ($H_2O_2$) (31%), $NH_4OH$ (28%), hydrochloric acid (HCl) (37%), and HF (49%) (percentages represent weight percentages in aqueous solutions). The reaction chamber where the electronic component precursors are being treated is in liquid communication with the storage tanks. A control valve and pump may be used as processing equipment between the storage tanks and the reaction chamber.

It is preferred, that the electronic component precursors treated in accordance with the methods of the invention be housed in an enclosed vessel (ie., a "full flow" vessel or single tank system), preferably such as those disclosed in, for example, U.S. Pat. Nos. 4,778,532; 4,984,597; 4,911, 761; 4,633,893; 4,917,123; 4,738,272; and 4,577,650, the disclosures of which are herein incorporated by reference in their entirety. Such "full flow" or "single tank" methods are preferred because they result in a more uniform treatment of the electronic component precursors and are more efficient. In addition, often the chemicals utilized in the chemical treatment of electronic component precursors are quite dangerous in that they may be strong acids, alkalis, or volatile solvents. Full flow vessels minimize the hazards associated with such process liquids by avoiding atmospheric contamination and personnel exposure to the chemicals, and by making handling of the chemicals safer. Although vessels as disclosed in the above-identified U.S. patents are preferred, any such reaction chamber known to persons skilled in the art may be used without departing from the spirit of the invention.

Generally, in practicing a preferred embodiment of the invention, the electronic component precursors will be placed in a single tank and the process (reactive and/or nonreactive) liquids will be introduced into the vessel through a valve or injection port. For example, in one aspect of the invention, the electronic component precursors are maintained in a single reaction chamber during the entire wet chemical treatment process (i.e., cleaning, rinsing, and drying) and the process liquids (reactive and/or nonreactive) are introduced into the reaction chamber. In this aspect of the invention, the electronic component precursors are placed in a reaction chamber and the surfaces of the electronic component precursors are contacted with one or more process liquids, for a selected period of time without removing the electronic component precursors from the reaction chamber. In general, a reactive chemical process liquid is introduced into the reaction chamber and, after the electronic component precursors are exposed to the process liquid for a specified time, a rinsing liquid is introduced into the reaction chamber without first removing the reactive chemical process liquid form the reaction chamber. The rinsing liquid directly displaces the reactive chemical process liquid from the surfaces of the electronic component precursors and the nonreactive chemical process liquid and/or rinsing liquid has a temperature different than the reactive chemical process liquid. For example, where the DI water is introduced from the bottom, it is more efficient to displace the chemicals with DI water that is at least 5° C. cooler than the chemicals that are being displaced. If the DI water is introduced from the top of the reaction chamber, it is more efficient to use DI water that is at least 5° C. warmer than the chemicals being displaced.

The process liquids, including those such as ammonium hydroxide ($NH_4OH$), hydrogen peroxide ($H_2O_2$), hydrochloric acid (HCl), and hydrofluoric acid (HF), are stored in tanks external to the reaction chamber. The reaction chamber where the electronic component precursors are being treated is in liquid communication with the chemical storage tanks via a liquid line. A control valve and pump is generally used to transport process liquids from the storage area through the liquid line to the reaction chamber. A processing control system, such as a personal computer, is typically used as a means to monitor reaction conditions (ie., flow rates, mix rates, exposure times, and temperature). For example, the processing control system will be used to program the flow rates and injection rates so that the appropriate concentration of chemicals will be present in the reactive chemical process liquids (or nonreactive chemical process liquid).

Often, more than one "active chemical" process liquid is being introduced into the reaction chamber for a single chemical treatment step. For example, the first step in a cleaning process may be Standard Cleaning 1(SC1). Typical concentrations for SC1 range from about 5:1:1 (Water:$H_2O_2$:$NH_4OH$) to about 1000:1:1 by volume of the concentrated solution (which are actually 31% $H_2O_2$ and 28% $NH_4OH$ by weight in aqueous solutions). Each of the components of SC1 are maintained in separate storage containers and an amount of each of the process liquids will be injected (via a processing control system) into a channel (liquid line) that is in liquid communication with the reaction chamber so that the appropriate ratio of each component is achieved.

Using the methods of the present invention, the electronic component precursors can be treated with any number of process liquids.

For example, the electronic component precursors may be treated with three process liquids, wherein the first process liquid is a solution of water, hydrogen peroxide, and ammonium hydroxide (about 80:3:1) (SC1); the second process liquid is a solution of water, hydrogen peroxide, and hydrochloric acid (about 80:1:1) (SC2) (which are actually 31% $H_2O_2$ and 37% HCl by weight in aqueous solutions); and the third process liquid is hydrofluoric acid (about 4:1 to about 1000:1 (Water:HF)) (which is actually 49% HF by weight in aqueous solution). This sequence may also be run in a different order (e.g., HF, SC1, SC2). This method is particularly useful for cleaning and etching (ie., removing oxide from the wafer surface). After treatment with each process liquid, the chamber is rinsed. The temperature of the rinsing liquid is dependent on the temperature of the process fluid and the configuration of the chamber. In the preceding example in a system in which displacement is from the bottom (which is for illustrative purposes only):

SC1 45° C. then rinse is preferably equal to or less than 40° C.

SC2 45° C. then rinse is preferably equal to or less than 40° C.

HF 35° C. then rinse is preferably equal to or less than 30° C.

It is recognized that changes in temperature may change the flow rate of the various liquids, but it is nonetheless preferred that the temperature of the rinsing liquid be at least about 5° C. warmer or cooler than the chemical treatment liquid, depending on whether the rinse liquid is introduced from the to or bottom (as explained above). The warmer or cooler rinse fluid is introduced into the vessel such that the electronic component precursors are exposed to the rinse liquid, in certain embodiments, for about 1–5 vessel volumes. After this exposure, the temperature of the rinse liquid is adjusted to a temperature that yields maximum flow rate.

For example, in a preferred embodiment of the invention, the rinse liquid (i.e., DI water) is introduced from the bottom of the reaction chamber and is at a temperature of at least about 5° C. cooler than the reactive chemical process liquid (generally, the rinse liquid should be as cold as possible without reducing flow rates) and the electronic component precursors are exposed to between about 1–5 vessel volumes of the cooler rinse liquid, more preferably between about 2–3 vessel volumes of the cooler rinse liquid. After this exposure of the electronic component precursors to the cooler rinse liquid, the temperature of the rinse liquid is adjusted to achieve maximum flow rate. For example, in the CFM Full-Flow™ System, maximum flow rate is achieved at 35° C. The most preferred method is one where the rinse liquid is 5° C. colder than the reactive chemical process liquid and this cooler temperature also yields maximum flow rate.

Persons skilled in the art can readily determine the temperature at which there is maximum flow rate in any wet processing technique. If it is determined that the maximum flow rate is at a temperature that is outside of the temperature range discussed, then the electronic component precursors may be rinsed for between about 1–5 vessel volumes with the rinse liquid, more preferably about 2–3 vessel volumes, and the rinse liquid should then be adjusted to a temperature that yields maximum flow rate.

In certain other embodiments, the rinse liquid is introduced from the top of the reaction chamber and is at least 5° C. warmer than the reactive chemical process liquids being displaced (generally, when introduced from the top, the liquid should be as warm as possible without reducing flow rates). The preferred embodiments of such a top-introduction system are similar to those discussed above in connection with the rinse liquid that is 5° C. colder than the reactive chemical process liquid with the exception of the initial temperature being warmer.

In other embodiments of the invention, the electronic component precursors may be treated with a further series of process liquids, such as a solution of sulfuric acid saturated with ozone, followed by a solution of hydrogen peroxide and ammonium hydroxide and then a solution of hydrogen peroxide, hydrochloric acid, and water. This method is particularly useful for the removal of organic as well as general cleaning (i.e., particle removal with minimal metal deposition) leaving a hydrophilic surface. The concentrations and temperatures set forth above are applicable in such embodiments.

The methods of the invention may also be used for etching the surfaces of semiconductor wafers to remove any unwanted oxide layer from the silicon surface. The present invention may also be used in controlled oxide etching. Typical etchants for silicon dioxide include, without limitation, hydrofluoric acid, or ammonium fluoride buffered hydrofluoric acid. The concentrations and temperatures set forth above are applicable to these embodiments as well.

After the electronic component precursors have been treated with the last reactive chemical process liquid, and rinsed as described above, any drying method known to those skilled in the art may be used without departing from the spirit of the present invention. After the electronic component precursors are dried, they can be removed from the reaction chamber.

EXAMPLES

Cold Displacement

Example 1

The effect of cold rinsing on particle performance in semiconductor wafer processing was studied. Bare silicon test wafers were processed in a CFM Technologies, Inc. Full-Flow 8100™. The wafers were cleaned with an SC1-HF process. 26 batches of 100 test wafers were processed with standard rinsing. In this method of rinsing, the chemical (reactive process liquid) is displaced from the process vessel with a rinsing liquid (i.e., water) that is at the same temperature and flow rate as the reactive process liquid. This method of rinsing is used so that the concentration versus time profile of the chemical injection matches that of the chemical displacement, as shown in FIG. 1.

After one minute of displacement (or approximately 2–4 vessel volumes (in this instance, the vessel volume is approximately 6.2 gallons)), the temperature of the rinse liquid is lowered to the point where maximum flow rate can be obtained in the Full-Flow™ tool. The rinse is then cycled between high and low and flow rates in one minute cycles for the duration of the rinse. For example, following an SC1 process step at 45° C., the rinse would run for 1 minute at 45° C. and 18 gpm. The rinse would then cycle back and forth in one minute cycles at 35° C. between 25 gpm and 12 gpm. The rinse would cycle back and forth between these two set points for the duration of the rinse (i.e., around 5 minutes). Following an HF step, the initial chemical (reactive process liquid) is displaced by a rinse liquid at 35° C. for 1 minute (2–3 vessel volumes). Since the maximum flow rate in most installations of a Full-Flow™ tool can be achieved at approximately 35° C., the rinse temperature would not be lowered, but would stay constant. The rinse would then cycle back and forth in one minute cycles at 35° C. between 25 gpm and 12 gpm. The rinse would cycle back and forth between these two set points for the duration of the rinse (i.e., around 5 minutes).

One wafer was monitored in each of the 26 batches. The particle count of the wafer was measured before and after cleaning, and the number of particles added to the wafer during processing is recorded in Table 3. The process used to clean the first 26 batches of wafers is summarized in Table 1.

TABLE 1

Process Parameters for Standard SC1-HF Cleaning:

| Process Step | Temperature | Total Process Time | Flow Rate | Concentration |
| --- | --- | --- | --- | --- |
| SC1 | 45° C. | 5 min. | 18 gpm during chemical injection | 80:2:1 (Water:H2O2: NH4OH) |
| Initial Rinse/Chemical Displacement | 45° C. | 1 min. | 18 gpm | NA |
| Rinse | 35° C. | 5 min. | 25 gpm and 12 gpm cycles | NA |
| HF | 35° C. | 2 min. | 18 gpm during chemical injection | 100:1 |
| Initial Rinse/Chemical Displacement | 35° C. | 1 min. | 18 gpm | NA |
| Rinse | 35° C. | 5 min. | 25 gpm and 12 gpm cycles | NA |
| IPA Dry | | 8 min. | | |

A second set of 26 wafers was processed under identical conditions, except for the initial portion of the rinses (the displacement step). The wafers were processed with displacement rinses that were initially substantially colder than the prior chemical treatment step. In other words, the chemical (reactive process fluid) was displaced from the vessel with DI water (rinse liquid) that was substantially colder than the chemical step. The flow rate was the same as the chemical injection step into the vessel. Following the displacement step, the rinse was again run at the temperature where maximum flow rate can be achieved, i.e., around 35° C. The flow rate, but not the temperature, was cycled during the remainder of the rinsing in 1 minute cycles. Again, particle count was measured on 1 wafer before and after the cleaning process and the number of particles added during processing is recorded in Table 3. The process used to clean the second 26 batches of wafers is given in Table 2. Note that the displacement step is 1 minute at 18 gpm, or 18 gallons of water. The vessel volume is approximately 6.2 gallons. Thus, the displacement is between 2 and 3 vessel volumes.

TABLE 2

Process Parameters for SC1-HF Cleaning with Cold Rinsing:

| Step | Temperature | Total Process Time | Flow Rate | Concentration |
| --- | --- | --- | --- | --- |
| SC1 | 45° C. | 5 min. | 18 gpm during chemical injection | 80:2:1 (Water:H2O2: NH4OH) |
| Initial Rinse/Chemical Displacement | 35° C. | 1 min. | 18 gpm | NA |
| Rinse | 35° C. | 5 min. | 25 gpm and 12 gpm cycles | NA |
| HF | 35° C. | 2 min. | 18 gpm during chemical injection | 100:1 |

TABLE 2-continued

Process Parameters for SC1-HF Cleaning with Cold Rinsing:

| Step | Temperature | Total Process Time | Flow Rate | Concentration |
| --- | --- | --- | --- | --- |
| Initial Rinse/Chemical Displacement | 25° C. | 1 min. | 18 gpm | NA |
| Rinse | 35° C. | 5 min. | 25 gpm and 12 gpm cycles | NA |
| IPA Dry | | 8 min. | | |

Figure 2:
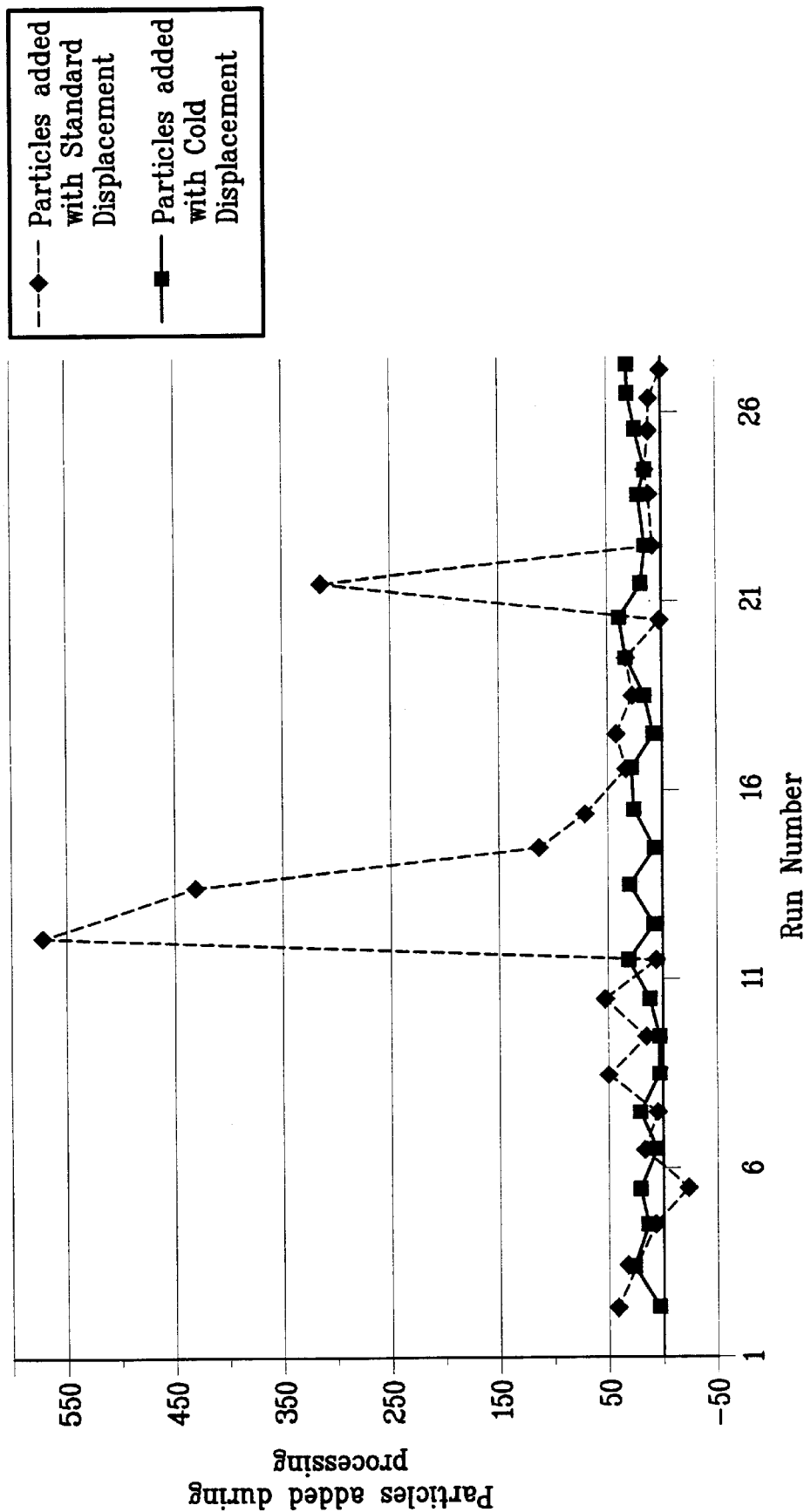
FIG. 2 is a graph showing the number of particulates added during processing of wafers using either standard rinsing techniques or the rinsing technique of the present invention, based upon the methods set forth in Example 1 below.

The number of particles added to the monitor wafers during processing for each run are shown in Table 3 for both processes. The average change and standard deviation are also given. The number of particulates added are also plotted in FIG. 2. These results suggest that cold rinsing lowers the number of particles added during processing since the average number of particles added is smaller for the wafers that were cleaned using cold rising. Furthermore, the wafers cleaned using cold rinsing were consistently cleaner as shown by the standard deviation. The wafers cleaned with standard rinsing exhibit large variations in the number of particles added.

TABLE 3

Results of Cold Rinsing Study

| Run Number | Particles added (Stdrd. Rinsing) | Particles added (Cold Rinsing) |
| --- | --- | --- |
| 1 | 41 | 3 |
| 2 | 29 | 18 |
| 3 | 4 | 11 |
| 4 | −23 | 15 |
| 5 | 21 | 11 |
| 6 | 6 | 21 |
| 7 | 53 | 0 |
| 8 | 8 | 0 |
| 9 | 53 | 11 |
| 10 | 8 | 29 |
| 11 | 577 | 6 |
| 12 | 426 | 27 |
| 13 | 113 | 0 |
| 14 | 76 | 22 |
| 15 | 34 | 28 |
| 16 | 45 | 6 |
| 17 | 25 | 14 |
| 18 | 25 | 26 |
| 19 | −1 | 31 |
| 20 | 307 | 14 |
| 21 | 6 | 12 |
| 22 | 7 | 20 |
| 23 | 15 | 13 |
| 24 | 11 | 16 |
| 25 | 9 | 25 |
| 26 | −3 | 22 |
| Average | 19 | 12 |
| Std. Dev. | 142.3598 | 9.36877 |

Although the present invention has been described with reference to preferred embodiments, persons skilled in the art will recognize that changes may be made in form and detail without departing from the spirit and scope of the invention. Further, the examples set forth herein are for illustrative purposes and are not intended to limit the scope of the claimed invention, and persons skilled in the art will recognize that variations of the examples disclosed herein may be made without departing from the spirit of the invention.

What is claimed is:

1. A method for the manufacture of electronic component precursors comprising:
   a) placing the electronic component precursors in a reaction chamber having a top and a bottom;
   b) introducing a reactive chemical process liquid into the reaction chamber;
   c) exposing said electronic component precursors to the reactive chemical process liquid for a selected period of time;
   d) introducing a nonreactive process liquid into the reaction chamber to directly displace the reactive chemical process liquid, wherein said nonreactive process liquid is introduced into the reaction chamber through the bottom of the chamber and has a temperature that is at least 5° C. lower than the reactive chemical process liquid; and
   e) removing said nonreactive process liquid from the reaction chamber;
   wherein steps b) through d) may be performed repeatedly.

2. The method of claim 1 wherein said reactive process liquid is one or more liquids selected from the group consisting of aqueous solutions of hydrochloric acid and buffers comprising the same, ammonium hydroxide and buffers comprising the same, hydrogen peroxide, sulfuric acid and buffers comprising the same, mixtures of sulfuric acid and ozone, hydrofluoric acid and buffers comprising the same, chromic acid and buffers comprising the same, phosphoric acid and buffers comprising the same, acetic acid and buffers comprising the same, nitric acid and buffers comprising the same, ammonium fluoride buffered hydrofluoric acid, and combinations thereof.

3. The method of claim 1 wherein said nonreactive process liquid is one or more liquids selected from the group consisting of deionized water and dilute solutions of deionized water or organic solvents.

4. The method of claim 1 wherein the reaction chamber is a single bath system.

5. A method for the manufacture of electronic component precursors comprising:
   a) placing the electronic component precursors in a reaction chamber having a top and a bottom;
   b) introducing a reactive chemical process liquid into the reaction chamber;
   c) exposing said electronic component precursors to the reactive chemical process liquid for a selected period of time;
   d) introducing a nonreactive process liquid into the reaction chamber to directly displace the reactive chemical process liquid, wherein said nonreactive process liquid is introduced into the reaction chamber through the top of the chamber and has a temperature that is at least 5° C. higher than the reactive chemical process liquid; and
   e) removing said nonreactive process liquid from the reaction chamber;
   wherein steps b) through d) may be performed repeatedly.

6. The method of claim 5 wherein said reactive chemical process liquid is one or more liquids selected from the group consisting of aqueous solutions of hydrochloric acid and buffers comprising the same, ammonium hydroxide and buffers comprising the same, hydrogen peroxide, sulfuric acid and buffers comprising the same, mixtures of sulfuric acid and ozone, hydrofluoric acid and buffers comprising the same, chromic acid and buffers comprising the same, phosphoric acid and buffers comprising the same, acetic acid and buffers comprising the same, nitric acid and buffers comprising the same, ammonium fluoride buffered hydrofluoric acid, and combinations thereof.

7. The method of claim 5 wherein said nonreactive process liquid is one or more liquids selected from the group consisting of deionized water and dilute solutions of deionized water and organic solvents.

8. The method of claim 5 wherein the reaction chamber is a single bath system.

9. A method for the manufacture of electronic component precursors comprising:
   a) placing the electronic component precursors in a reaction chamber having a top and a bottom;
   b) introducing a reactive chemical process liquid into the reaction chamber;
   c) exposing said electronic component precursors to the reactive chemical process liquid for a selected period of time;
   d) introducing a nonreactive process liquid into the reaction chamber to directly displace the reactive chemical process liquid, wherein said nonreactive process liquid is introduced into the reaction chamber through the bottom of the chamber and has a temperature that is at least 5° C. lower than the reactive chemical process liquid;
   e) exposing said electronic component precursors to the nonreactive process liquid that has a temperature that is at least 5° C. lower than the reactive chemical process liquid so that said electronic component precursors are exposed to between about 1–5 vessel volumes of such nonreactive process liquid;
   f) continuing to expose the electronic component precursors to additional volumes of nonreactive process liquid; and
   g) removing said nonreactive process liquid from the reaction chamber;
   wherein steps b) through g) may be performed repeatedly.

10. The method of claim 9 wherein said reactive process liquid is one or more liquids selected from the group consisting of aqueous solutions of hydrochloric acid and buffers comprising the same, ammonium hydroxide and buffers comprising the same, hydrogen peroxide, sulfuric acid and buffers comprising the same, mixtures of sulfuric acid and ozone, hydrofluoric acid and buffers comprising the same, chromic acid and buffers comprising the same, phosphoric acid and buffers comprising the same, acetic acid and buffers comprising the same, nitric acid and buffers comprising the same, ammonium fluoride buffered hydrofluoric acid, and combinations thereof.

11. The method of claim 9 wherein said nonreactive process liquid is one or more liquids selected from the group consisting of deionized water and dilute solutions of deionized water and organic solvents.

12. The method of claim 9 wherein the reaction chamber is a single bath system.

13. The method of claim 9 further comprising the step of changing the temperature of the nonreactive process liquid of step f) from the temperature used for step e).

14. A method for the manufacture of electronic component precursors comprising:
   a) placing the electronic component precursors in a reaction chamber having a top and a bottom;
   b) introducing a reactive chemical process liquid into the reaction chamber;
   c) exposing said electronic component precursors to the reactive process liquid for a selected period of time;

d) introducing a nonreactive process liquid into the reaction chamber to directly displace the reactive chemical process liquid, wherein said nonreactive process liquid is introduced into the reaction chamber through the top of the chamber and has a temperature that is at least 5° C. higher than the reactive chemical process liquid;

e) exposing said electronic component precursors to the nonreactive process liquid that has a temperature that is at least 5° C. higher than the reactive chemical process liquid so that said electronic component precursors are exposed to between about 1-5 vessel volumes of such nonreactive process liquid; and f) continuing to expose the electronic component precursors to additional volumes of nonreactive process liquid; and g) removing said nonreactive process liquid from the reaction chamber;

wherein steps b) through g) may be performed repeatedly.

15. The method of claim 14 wherein said reactive process liquid is one or more liquids selected from the group consisting of aqueous solutions of hydrochloric acid and buffers comprising the same, ammonium hydroxide and buffers comprising the same, hydrogen peroxide, sulfuric acid and buffers comprising the same, mixtures of sulfuric acid and ozone, hydrofluoric acid and buffers comprising the same, chromic acid and buffers comprising the same, phosphoric acid and buffers comprising the same, acetic acid and buffers comprising the same, nitric acid and buffers comprising the same, ammonium fluoride buffered hydrofluoric acid, and combinations thereof.

16. The method of claim 14 wherein said nonreactive process liquid is one or more liquids selected from the group consisting of deionized water and dilute solutions of deionized water and organic solvents.

17. The method of claim 14 wherein the reaction chamber is a single bath system.

18. The method of claim 14 further comprising the step of changing the temperature of the nonreactive process liquid of step f) from the temperature used for step e).

* * * * *